(12) United States Patent
Lim et al.

(10) Patent No.: US 9,530,963 B2
(45) Date of Patent: Dec. 27, 2016

(54) METHODS OF MANUFACTURING ORGANIC LIGHT-EMITTING DEVICE

(71) Applicant: Electronics and Telecommunications Research Institute, Daejeon (KR)

(72) Inventors: Jong Tae Lim, Seoul (KR); Jeong Ik Lee, Daejeon (KR); Hye Yong Chu, Daejeon (KR); Joon Tae Ahn, Daejeon (KR); Jonghee Lee, Daejeon (KR); Jun-Han Han, Daejeon (KR); Ji-Young Oh, Daejeon (KR); Byoung Gon Yu, Yeongdong-gun (KR); Jaehyun Moon, Daejeon (KR); Nam Sung Cho, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 96 days.

(21) Appl. No.: 14/449,226

(22) Filed: Aug. 1, 2014

(65) Prior Publication Data
US 2015/0214485 A1 Jul. 30, 2015

(30) Foreign Application Priority Data
Jan. 24, 2014 (KR) .......................... 10-2014-0009047

(51) Int. Cl.
| | | |
|---|---|---|
| H01L 21/302 | (2006.01) | |
| H01L 33/44 | (2010.01) | |
| H01L 51/56 | (2006.01) | |
| B32B 9/00 | (2006.01) | |
| H01L 51/00 | (2006.01) | |
| H01L 51/50 | (2006.01) | |
| H01L 51/52 | (2006.01) | |
| H01L 21/02 | (2006.01) | |

(52) U.S. Cl.
CPC ....... H01L 51/0022 (2013.01); H01L 51/5092 (2013.01); H01L 51/5206 (2013.01); H01L 51/5234 (2013.01); H01L 21/02491 (2013.01); H01L 21/02527 (2013.01); H01L 51/56 (2013.01)

(58) Field of Classification Search
None
See application file for complete search history.

(56) References Cited

U.S. PATENT DOCUMENTS 8,592,246 B2   11/2013  Park
2004/0253820 A1*  12/2004  DeHeer ............... H01L 21/0405
                                                      438/689

(Continued)

*Primary Examiner* — Pamela E Perkins
(74) *Attorney, Agent, or Firm* — Rabin & Berdo, P.C.

(57) ABSTRACT

Provided is a method of manufacturing an organic light-emitting device including a graphene layer. The method of manufacturing an organic light-emitting device according to the present invention may include providing a graphene donor unit including a patterned graphene layer, providing a device unit, and attaching the graphene layer of the graphene donor unit to an organic part. The device unit may include a substrate, a lower electrode, and the organic part which are sequentially stacked, and the organic part may include a dopant. The graphene donor unit may include the graphene layer, a release layer, and an elastic stamp layer which are sequentially stacked.

20 Claims, 12 Drawing Sheets

(56) References Cited

U.S. PATENT DOCUMENTS

| | | | |
|---|---|---|---|
| 2012/0070641 A1* | 3/2012 | Choi | B82Y 30/00 428/215 |
| 2012/0153286 A1* | 6/2012 | Yoon | B82Y 10/00 257/59 |
| 2012/0282419 A1* | 11/2012 | Ahn | B82Y 30/00 428/34.8 |
| 2014/0087501 A1* | 3/2014 | Chen | H01L 51/5206 438/29 |
| 2015/0014600 A1* | 1/2015 | Jeon | C01B 31/0446 252/502 |

* cited by examiner

METHODS OF MANUFACTURING ORGANIC LIGHT-EMITTING DEVICE

CROSS-REFERENCE TO RELATED APPLICATIONS

This U.S. non-provisional patent application claims priority under 35 U.S.C. §119 of Korean Patent Application No. 10-2014-0009047, filed on Jan. 24, 2014, the entire contents of which are hereby incorporated by reference.

BACKGROUND

The present invention disclosed herein relates to organic light-emitting devices, and more particularly, to methods of manufacturing an organic light-emitting device including a graphene layer.

An organic light-emitting device is a self light-emitting device, in which an organic light-emitting material is electrically excited to emit light. The organic light-emitting device includes a substrate, a cathode, an anode, and a light-emitting material layer formed between the cathode and the anode. When a voltage is applied to the organic light-emitting device, electrons injected from the cathode and holes injected from the anode are recombined at luminescent centers of the light-emitting material layer to form molecular excitons. The molecular excitons emit light by releasing energy when returning to a ground state. Singlet excitation and triplet excitation are known as excited states and it is considered that light may be emitted through either of the excited states.

The organic light-emitting device has characteristics, such as ultra-lightness, high-speed response, and low voltage direct current operation, and is expected to be applied to advanced displays. Improvement of device structure or development of materials has been made to improve the characteristics of the organic light-emitting device.

SUMMARY

The present invention provides a method of manufacturing an organic light-emitting device including a graphene layer without damage to an organic part.

The present invention also provides an organic light-emitting device having improved luminous efficiency.

Embodiments of the present invention provide methods of manufacturing an organic light-emitting device including: providing a graphene donor unit, wherein the graphene donor unit includes a graphene layer, a release layer, and an elastic stamp layer which are sequentially stacked; providing a device unit, wherein the device unit includes a substrate, a lower electrode, and an organic part which are sequentially stacked; contacting the graphene layer of the graphene donor unit with the organic part; and removing the release layer and the elastic stamp layer.

In some embodiments, the providing of the graphene donor unit may include patterning the graphene layer.

In other embodiments, the providing of the device unit may further include doping an upper portion of the organic part, and adhesion between the doped organic part and the graphene layer may be greater than adhesion between the graphene layer and the release layer.

In still other embodiments, the providing of the graphene donor unit may include: forming a graphite catalyst layer on a mother substrate; forming the graphene layer on the graphite catalyst layer; patterning the graphene layer; contacting the graphene layer with one side of the release layer, wherein the elastic stamp layer is provided on the other side of the release layer; and etching the graphite catalyst layer to remove the graphite catalyst layer and the mother substrate.

In even other embodiments, the providing of the graphene donor unit may include: forming a hydrophilic functional group on a first side of the elastic stamp layer; providing a self-assembly material on the hydrophilic functional group of the elastic stamp layer; and forming the release layer on the elastic stamp layer by bonding the self-assembly material to the hydrophilic functional group of the elastic stamp layer.

In yet other embodiments, the self-assembly material may include polydimethylsiloxane having a monocarbinol functional group.

In further embodiments, the providing of the graphene donor unit may include: forming a self-assembly layer on a first side of the elastic stamp layer; forming a silicon polymer layer on the self-assembly layer; and forming the release layer by irradiating the silicon polymer layer with ultraviolet light, wherein the release layer may include the self-assembly layer and the silicon polymer layer.

In still further embodiments, the forming of the release layer may include polymerizing a material included in the silicon polymer layer and a material included in the self-assembly layer.

In even further embodiments, the graphene donor unit may further include a plastic film provided between the release layer and the elastic stamp layer.

In yet further embodiments, forming of the graphene donor unit may include: providing the plastic film; forming a release layer on a first side of the plastic film, wherein the release layer may include methacrylate-multifunctionalized silsesquioxane; and forming the elastic stamp layer on the other side of the plastic film.

In much further embodiments, the graphene layer may be conformally contacted with the organic part.

In other embodiments of the present invention, methods of manufacturing an organic light-emitting device include: providing a graphene donor unit including a patterned graphene layer; providing a device unit, wherein the device unit includes a substrate, a lower electrode, and an organic part which are sequentially stacked and the organic part includes a dopant; and contacting the graphene layer of the graphene donor unit with the organic part.

In some embodiments, the graphene donor unit may include the graphene layer, a release layer, and an elastic stamp layer which are sequentially stacked.

In other embodiments, adhesion between the organic part and the graphene layer may be greater than adhesion between the graphene layer and the release layer, wherein an upper layer of the organic part in contact with the graphene layer may be doped.

In still other embodiments, the methods may further include removing the release layer and the elastic stamp layer.

In even other embodiments, the dopant may include metal carbonate, alkali metal, alkaline earth metal, metal halide, metal, or metal oxide.

In yet other embodiments, the device unit may further include an optical filter layer and an insulation layer that are disposed between the substrate and the lower electrode.

In further embodiments, the graphene layer may be conformally contacted with the organic part.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE EMBODIMENTS

Figure 1:
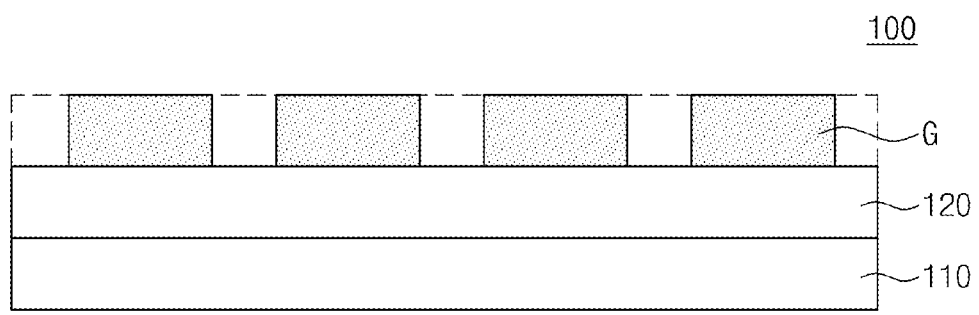
FIGS. 1 to 4 are cross-sectional views illustrating a preparation process of a graphene donor unit according to an embodiment of the present invention.

Preferred embodiments of the present invention will be described below in more detail with reference to the accompanying drawings in order to fully understand the constitution and effect of the present invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Those skilled in the art will understand that the present inventive concept can be implemented in an appropriate environment.

In the following description, the technical terms are used only for explaining a specific exemplary embodiment while not limiting the present invention. The terms of a singular form may include plural forms unless referred to the contrary. The meaning of "comprises" and/or "comprising" specifies a property, a region, a fixed number, a step, a process, an element and/or a component but does not exclude other properties, regions, fixed numbers, steps, processes, elements and/or components.

In addition, it will be understood that when an element such as a layer, film, region, or substrate is referred to as being "on" another element, it can be directly on the other element or intervening elements may also be present.

Also, though terms like a first, a second, and a third are used to describe various regions and layers in various embodiments of the present invention, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof. Like reference numerals refer to like elements throughout.

Unless otherwise defined, all terms used herein have the same meaning as commonly understood by one of ordinary skill in the art to which this inventive concept belongs.

Preparation of a graphene donor unit according to the concept of the present invention and a method of manufacturing an organic light-emitting device using the same will be described.

Hereinafter, a method of preparing a graphene donor unit according to embodiments of the present invention will be described with reference to the accompanying drawings.

FIGS. 1 to 4 are cross-sectional views illustrating a preparation process of a graphene donor unit according to an embodiment of the present invention.

Referring to FIG. 1, a graphene unit 100 including a mother substrate 110, a graphite catalyst layer 120, and a graphene layer G may be provided. For example, the graphite catalyst layer 120 may be formed on the mother substrate 110. The graphite catalyst layer 120 may include a metal, for example, nickel, copper, transition metal, and an alloy thereof. As illustrated by a dotted line, the graphene layer G may be formed on the graphite catalyst layer 120 by thermal chemical vapor deposition (CVD). Thereafter, the graphene layer G may be patterned in various shapes. For example, a mask (not shown) may be formed on the graphene layer G by a photolithography process. As another example, a mask (not shown) may be formed by an electron beam lithography process. The graphene layer G may be etched by using the mask (not shown). The etching of the graphene layer G may be performed by an oxygen plasma process using the mask (not shown) or by wet etching using a graphene combustion reaction. A composite layer (not shown) may be further formed on the graphene layer G in order to improve the electrical conductivity of the graphene layer G. The composite layer (not shown) may be a metal composite or a graphene composite doped with a dopant.

Figure 2:
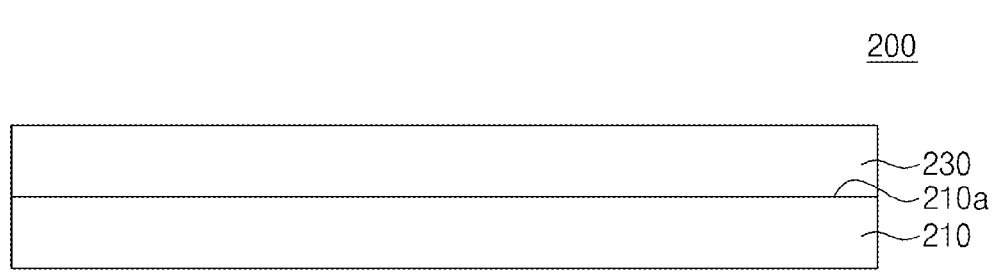

Referring to FIG. 2, a hydrophilic functional group may be formed on a first side 210a of an elastic stamp layer 210. The elastic stamp layer 210 may include polydimethylsiloxane (PDMS). For example, the elastic stamp layer 210 may include a material expressed by Chemical Formula 1.

<Chemical Formula 1>

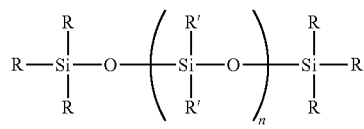

(where R is an alkyl group having a carbon number of 1 to 100, R' is alkyl, phenyl, or siloxanyl having a carbon number of 1 to 100, and n is a real number between 1 and 9,000,000.)

The first side 210a of the elastic stamp layer 210 may be irradiated with ultraviolet light and/or ozone for about 10 minutes. A hydrophilic functional group (e.g., hydroxyl group) may be formed on the first side 210a of the elastic stamp layer 210 by the irradiation of the ultraviolet light and/or ozone.

A release layer 230 may be formed on the first side 210a of the elastic stamp layer 210. For example, a self-assembly material may be provided on the first side 210a of the elastic stamp layer 210. The self-assembly material may be polydimethylsiloxane having a monocarbinol functional group at an end thereof. For example, the self-assembly material may include a material expressed by Chemical Formula 2.

<Chemical Formula 2>

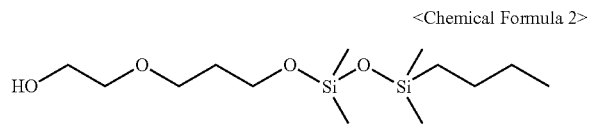 [SMILES: CCCC[Si](C)(C)O[Si](C)(C)OCCCOCCO]

As another example, the self-assembly material may be 2-methoxy(propyleneoxy)propyl trimethoxysilane (MeO$((CH_2)_2O)_{6\text{-}9}(CH_2)_3Si(OCH_3)_3$), tridecafluoro-1,1,2,2-tetrahydrooctyl trichlorosilane ($CF_3(CF_2)_5(CH_2)_2SiCl_3$), undecyltrichlorosilane ($CH_3(CH_2)_{10}SiCl_3$), octadecyltrichlorosilane ($CH_3(CH_2)_{17}SiCl_3$), and trimethoxyphenylsilane (($CH_3O)_3SiC_6H_5$), or a mixture thereof.

The elastic stamp layer 210 coated with the self-assembly material may be treated at a working pressure of $5\times10^{-4}$ torr and at a temperature of 60° C. for 2 hours. For example, the self-assembly material may be covalently bonded with a hydroxyl functional group of the elastic stamp layer 210 by a condensation reaction (e.g., dehydration condensation reaction) of the hydroxyl functional group of the elastic stamp layer 210 and hydrogen of the self-assembly material as the following Reaction Formula 1. Accordingly, the release layer 230 may be formed on the first side 210a of the elastic stamp layer 210.

<Reaction Formula 1>

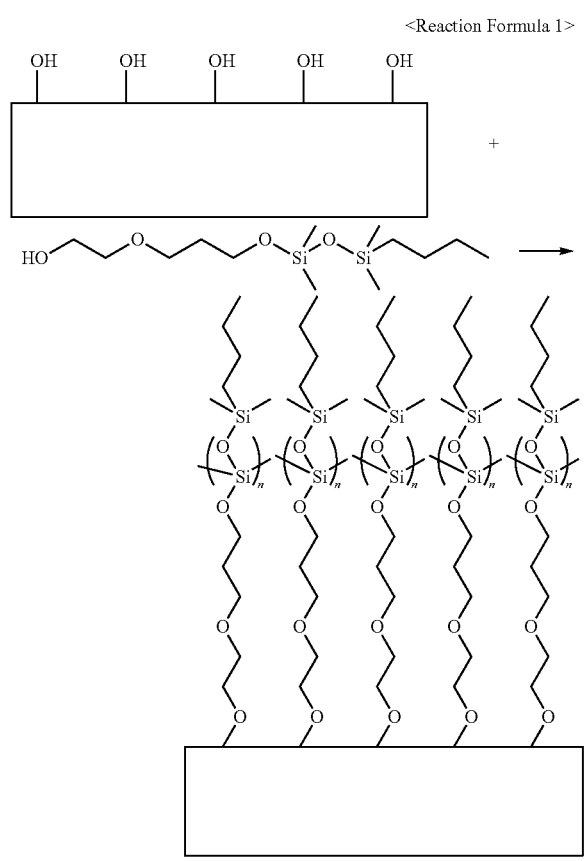

The release layer 230 includes the self-assembly material and the self-assembly material included in the release layer 230 may be bonded to the elastic stamp layer 210. Thereafter, the elastic stamp layer 210 and the release layer 230 may be cleaned. The cleaning process of the elastic stamp layer 210 and the release layer 230 may be performed by using toluene and acetone. Ultrasonic waves may be further used in the cleaning process.

Figure 3:
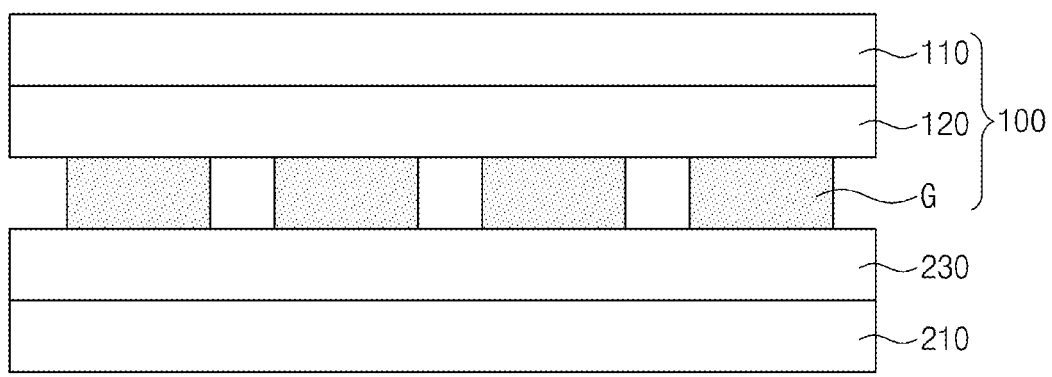

Referring to FIG. 3, the graphene layer G of the graphene unit 100 may be attached to the release layer 230. For example, the graphene unit 100 may be disposed on the release layer 230 to allow the graphene layer G to face the release layer 230. The graphene layer G may be in contact with the release layer 230. The contact of the graphene layer G may be conformal contact. The expression "conformal contact" may denote that air is completely removed and atomic layers between the graphene layer G and the release layer 230 are in contact with each other. The attachment process of the graphene layer G may be performed at a temperature of 25° C. to 300° C. and a pressure of $10^{-6}$ torr to 100 atm.

Figure 4:
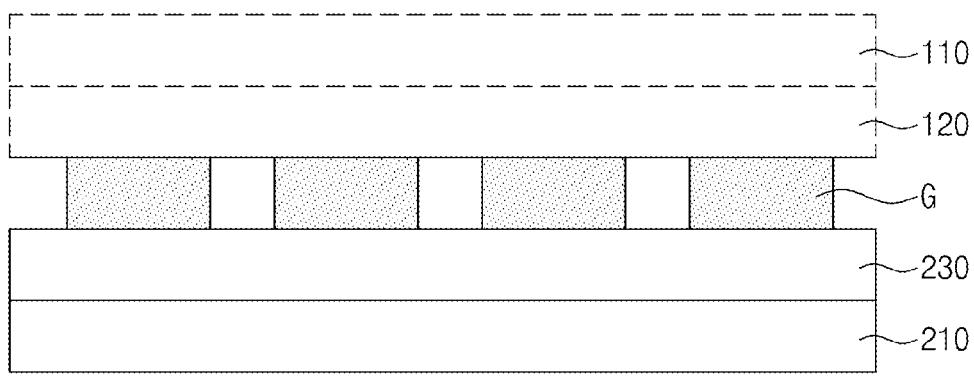

Referring to FIG. 4, the mother substrate 110 and the graphite catalyst layer 120 are removed from the graphene layer G to form a graphene donor unit 11. For example, the graphite catalyst layer 120 may be removed by reacting the graphite catalyst layer 120 with an etching solution. The etching solution may be a 0.1 M iron (III) chloride ($FeCl_3$) solution. The mother substrate 110 may be separated from the graphene layer G by removing the graphite catalyst layer 120. Accordingly, the graphene donor unit 11 including the elastic stamp layer 210, the release layer 230, and the graphene layer G may be formed.

Figure 5:
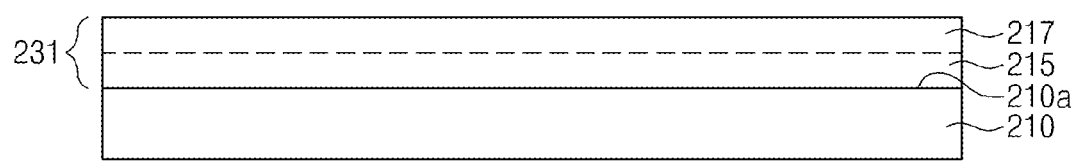
FIGS. 5 to 7 are cross-sectional views illustrating a preparation process of a graphene donor unit according to another embodiment of the present invention.
Figure 6:
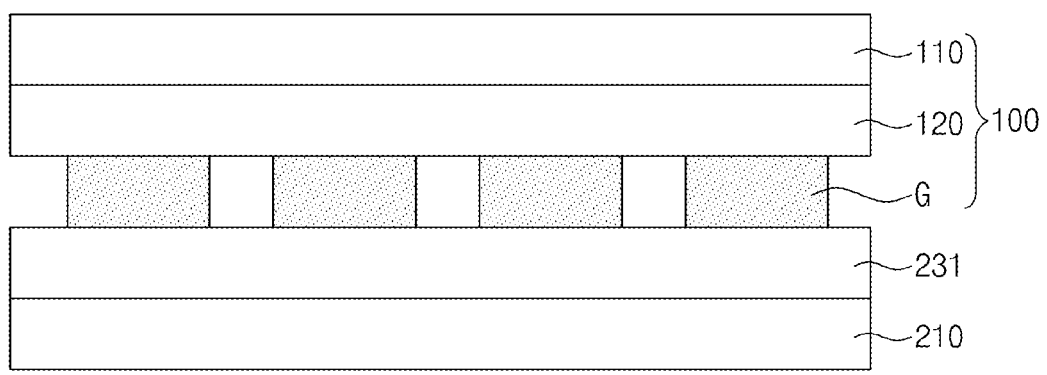
Figure 7:
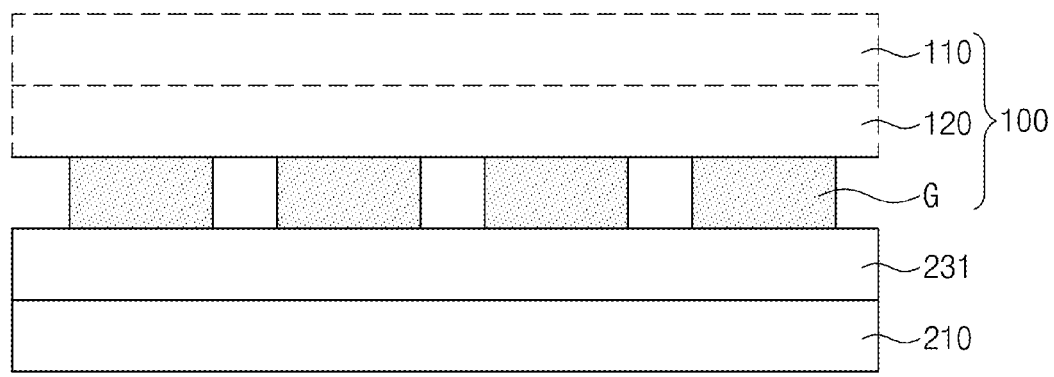

FIGS. 5 to 7 are cross-sectional views illustrating a preparation method of a graphene donor unit according to another embodiment of the present invention. Hereinafter, descriptions overlapping with the aforementioned descriptions will be omitted.

Referring to FIG. 5, a hydroxyl functional layer may be formed on first side 210a of an elastic stamp layer 210. A self-assembly material may be methacryloxyalkyl terminated polyalkylsiloxane. For example, polydimethylsiloxane expressed by Chemical Formula 3 (e.g., 3-methacryloxypropyltrimethoxysilane) may be used as the self-assembly material.

<Chemical Formula 3>

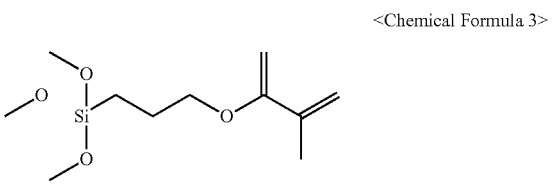

As another example, the self-assembly material of the present embodiment may be methacryloxyalkyl terminated polydialkylsiloxanes ($H_2CC(R)C(O)O(CH_2)_mSi(R)_2O(Si(R)_2O)_nSi(R)_2(CH_2)_mOC(O)C(R)CH_2$, where R is an alkyl group having a carbon number of 1 to 100, and m and n are each real numbers between 1 and 10,000), monomethacryloxyalkyl terminated polydialkylsiloxanes ($H_2CC(R)C(O)O(R)_mSi(R)_2O(Si(R)_2O)_nSi(R)_2R$, where R is an alkyl group having a carbon number of 1 to 100, and m and n are each real numbers between 1 and 10,000), monovinyl terminated dialkylsiloxanes ($H_2CCHSi(R)_2O(Si(R)_2O)_nSi(R)_2R$, where R is an alkyl group having a carbon number of 1 to 100 and n is a real number between 1 and 50), vinyl terminated dialkylsiloxanes $(H_2CCHSi(R)_2O(Si(R)_2O)_nSi(R)_2CHCH_2$, where R is an alkyl group having a carbon number of 1 to 100 and n is a real number between 1 and 50), vinyl terminated diarylsiloxane-dialkylsiloxane copolymers $(H_2CCHSi(R)_2O(Si(R)_2O)_m(Si(Ar)_2O)_nSi(R)_2CHCH_2$, where Ar is an aromatic group having a carbon number of 1 to 20, R is an alkyl group having a carbon number of 10 to 100, and n and m are each real numbers between 1 and 10,000), vinyl terminated siloxanes $((H_2CCHSi(O(Si(R)_2O)_mSi(R)_3)_3$, where R is an alkyl group having a carbon number of 1 to 100 and m is a real number between 1 and 10,000), monoepoxyalkyl terminated polyalkylsiloxanes $(EpRSi(R)_2O(Si(R)_2O)_nSi(R)_3$, where R is an alkyl group having a carbon number of 1 to 100, Ep is an epoxy group having a carbon number of 1 to 100, and n is a real number between 1 and 10,000), and (methacryloxyalkyl)alkylsiloxane-dimethylsiloxane copolymers $(R_3SiO(Si(R)_2O)_nSi(R)((CH_2)_mOC(O)C(R)CH_2)OSi(R)_3$, where R is an alkyl group having a carbon number of 1 to 100, and n and m are each real numbers between 1 and 10,000), or a mixture thereof.

The self-assembly material may be provided on the first side 210a of the elastic stamp layer 210. The elastic stamp layer 210 coated with the self-assembly material may be treated at a temperature of 120° C. Accordingly, the self-assembly material may be bonded to a hydroxyl functional group of the elastic stamp layer 210 by a methanol condensation reaction of the hydroxyl functional group of the elastic stamp layer 210 and the self-assembly material. The methanol condensation reaction of the hydroxyl functional group of the elastic stamp layer 210 and the self-assembly material, according to an embodiment of the present invention, may be expressed by Reaction Formula 2 below.

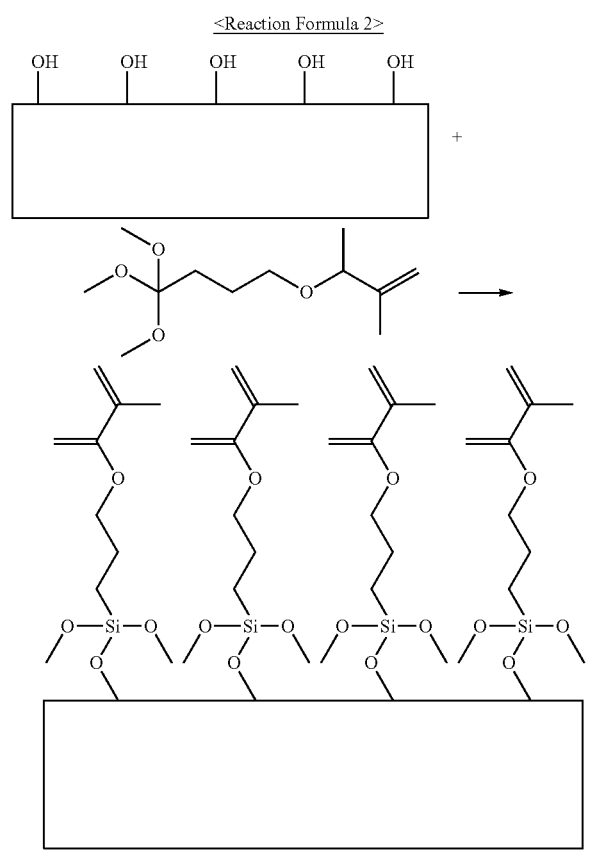

<Reaction Formula 2>

As illustrated by a dotted line, a self-assembly layer 215 may be formed on the first side 210a of the elastic stamp layer 210. Thereafter, the elastic stamp layer 210 and the self-assembly layer 215 may be cleaned. A precursor solution may be prepared by mixing a precursor, a cross-linking agent, and an initiator at a weight percent of 50:50:5. The precursor may include methacryloxypropyl terminated polydimethylsiloxane. A silicon polymer layer 217 may be formed by coating the self-assembly layer 215 with the precursor solution. A polymerization reaction of an acrylate functional group of the self-assembly layer 215 and an acrylate functional group of the methacryloxypropyl terminated polydimethylsiloxane of the silicon polymer layer 217 may be performed by ultraviolet irradiation. Accordingly, a release layer 231 may be formed. The release layer 231 may include the self-assembly layer 215 and the silicon polymer layer 217 bonded to the self-assembly layer 215.

Referring to FIG. 6, a graphene layer G of a graphene unit 100 may be in contact with the release layer 231. The contact may be conformal contact. For example, the graphene unit 100 may be stacked on the release layer 231 to allow the graphene layer G to face the release layer 231. The graphene layer G may be transferred to the release layer 231 at a temperature of 25° C. to 300° C. and a pressure of $10^{-6}$ torr to 100 atm.

Referring to FIG. 7, a mother substrate 110 and a graphite catalyst layer 120 may be removed from the graphene layer G to form a graphene donor unit 12. For example, the graphite catalyst layer 120 may be removed by reacting the graphite catalyst layer 120 with an etching solution. The etching solution may be a 0.1 M $FeCl_3$ solution. The mother substrate 110 may be separated from the graphene layer G by removing the graphite catalyst layer 120. Accordingly, the graphene donor unit 12 including the elastic stamp layer 210, the release layer 231, and the graphene layer G may be formed.

Figure 8:
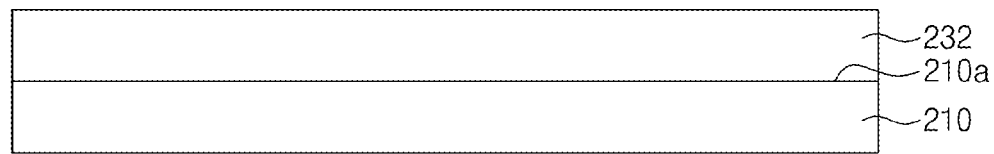
FIGS. 8 and 9 are cross-sectional views illustrating a preparation process of a graphene donor unit according to another embodiment of the present invention.
Figure 9:
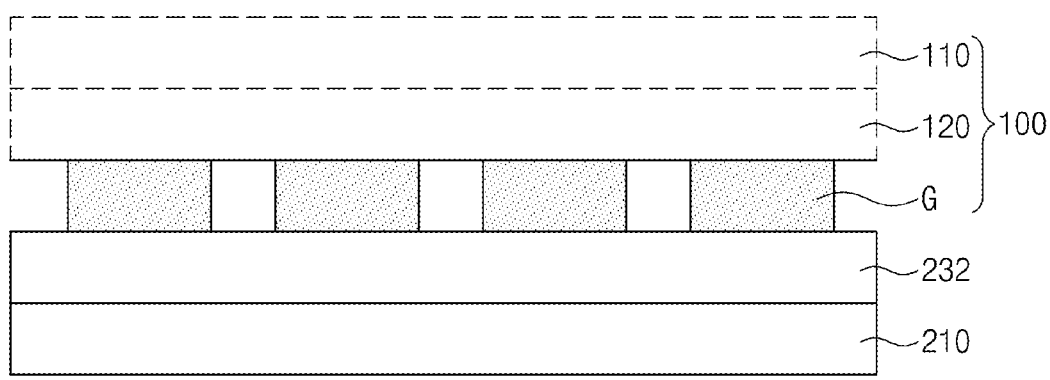

FIGS. 8 and 9 are cross-sectional views illustrating a preparation method of a graphene donor unit according to another embodiment of the present invention. Hereinafter, descriptions overlapping with the aforementioned descriptions will be omitted.

Referring to FIG. 8, a release layer 232 may be formed on first side 210a of an elastic stamp layer 210. The elastic stamp layer 210 may include polydimethylsiloxane. For example, a 0.5 wt % polyisobutylene (PIB) solution may be prepared. The PIB solution may be prepared by dissolving polyisobutylene in toluene. The first side 210a of the elastic stamp layer 210 may be spin-coated with the PIB solution at 200 rpm for 30 seconds. Thereafter, the elastic stamp layer 210 coated with the PIB solution may be dried at 40° C. for 30 minutes in vacuum. Accordingly, the release layer 232 may be formed on the elastic stamp layer 210.

As another example, the release layer 232 may be prepared by using at least one selected from the group consisting of polyvinylidene fluoride (PVDF), poly(t-butyl methacrylate) (PtBMA), polystyrene (PS), polyvinyl acetate (PVAc), polyoxymethylene (POM), polymethyl methacrylate (PMMA), polyethylene oxide (PEO), poly(bisphenol-A-carbonate), AF2400 (Teflon®), and CTX-809SP2 (Cytop®).

Referring to FIG. 9, a graphene layer G of a graphene unit 100 may be attached to the release layer 232. The graphene unit 100 may be the graphene unit 100 previously described in the example of FIG. 1. For example, the graphene unit 100 may include a mother substrate 110, a graphite catalyst layer 120, and a graphene layer G. The mother substrate 110, the graphite catalyst layer 120, and the graphene layer G may be sequentially stacked. The mother substrate 110 and the graphite catalyst layer 120 may be removed from the graphene layer G to form a graphene donor unit 13. For example, the graphite catalyst layer 120 may be removed by reacting the graphite catalyst layer 120 with an etching solution. The graphite catalyst layer 120 may be removed by the same or similar method to that described in the example of FIG. 4.

Figure 10:
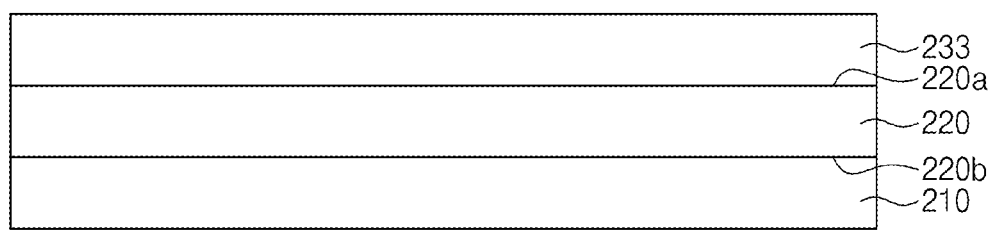
FIGS. 10 and 11 are cross-sectional views illustrating a preparation process of a graphene donor unit according to another embodiment of the present invention.
Figure 11:
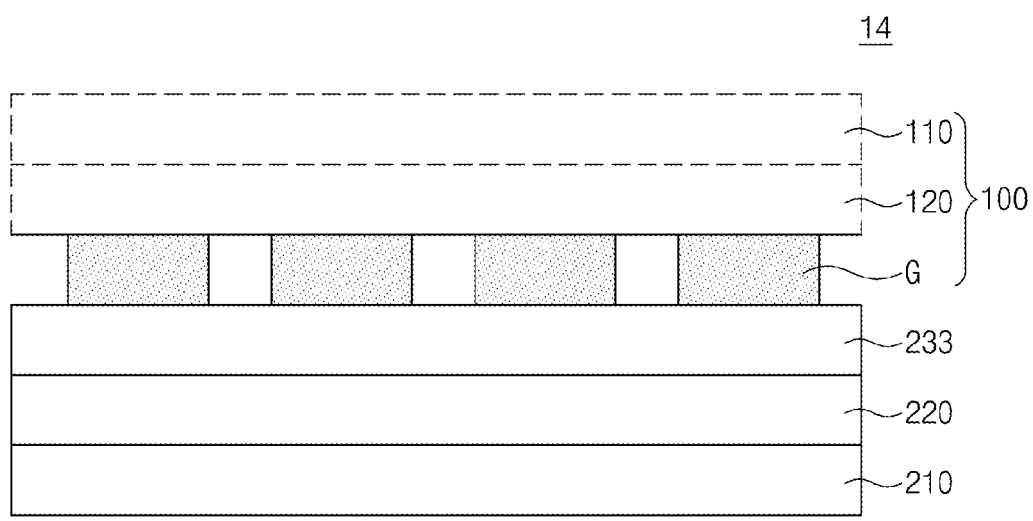

FIGS. 10 and 11 are cross-sectional views illustrating a preparation method of a graphene donor unit according to another embodiment of the present invention. Hereinafter, descriptions overlapping with the aforementioned descriptions will be omitted.

Referring to FIG. 10, a release layer 233 may be formed on one side 220a of a plastic film 220. For example, a hydrophilic functional group may be formed on the one side 220a of the plastic film 220 by ultraviolet irradiation. The plastic film 220 may include polyethylene terephthalate (PET). A precursor solution may be prepared by mixing a precursor, a cross-linking agent, and an initiator at a weight percent of 50:50:5. The precursor may be methacrylate-multifunctionalized silsesquioxane (SSQMA). For example, the precursor may be expressed by Chemical Formula 4. As another example, the precursor may be a silsesquioxane-based acrylic derivative.

<Chemical Formula 4>

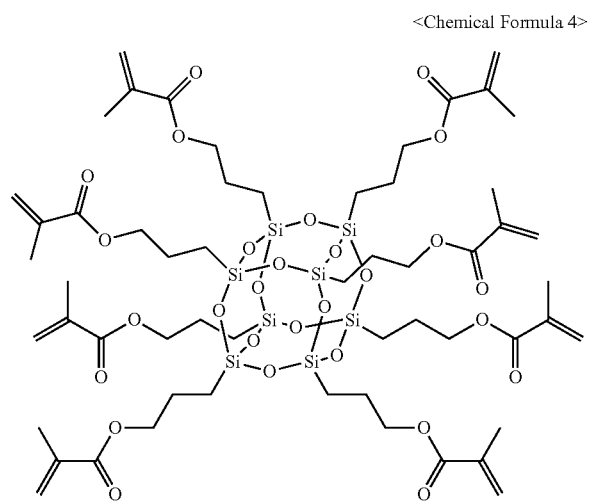 [SMILES: C=C(C)C(=O)OCCC[Si]12O[Si]3(CCCOC(=O)C(=C)C)O[Si]4(CCCOC(=O)C(=C)C)O[Si]5(CCCOC(=O)C(=C)C)O[Si](CCCOC(=O)C(=C)C)(O[Si](CCCOC(=O)C(=C)C)(O1)O[Si@](CCCOC(=O)C(=C)C)(O3)O5)O[Si@@](CCCOC(=O)C(=C)C)(O2)O4]

The cross-linking agent may be poly(propylene glycol) dimethacrylate (PPGDMA). For example, the cross-linking agent may be expressed by Chemical Formula 5.

<Chemical Formula 5>

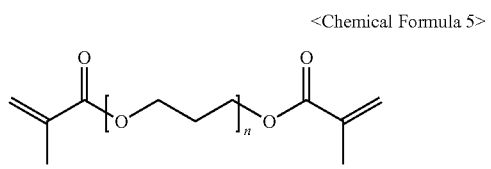

where n is an integer between 1 and 9,000,000.

The one side 220a of the plastic film 220 may be coated with the precursor solution. The one side 220a of the plastic film 220 coated with the precursor solution may be irradiated with ultraviolet light to form the release layer 233. An adhesion enhancement layer (not shown) may be included between the plastic film 200 and the release layer 233. The release layer 233 may be a silicon release layer. An elastic stamp layer 210 may be formed on the other side 220b of the plastic film 220.

Referring to FIG. 11, a graphene layer G of a graphene unit 100 may be attached to the release layer 233. The graphene unit 100 may include a mother substrate 110, a graphite catalyst layer 120, and the graphene layer G. The mother substrate 110, the graphite catalyst layer 120, and the graphene layer G may have a sequentially stacked structure. The graphene layer G may have a pattern. The graphene unit 100 may be stacked on the release layer 233 to allow the graphene layer G to face the release layer 233. The graphene layer G may be transferred to the release layer 233.

The mother substrate 110 and the graphite catalyst layer 120 may be removed from the graphene layer G. For example, the graphite catalyst layer 120 may be removed by reacting the graphite catalyst layer 120 with an etching solution. The mother substrate 110 may be separated from the graphene layer G by removing the graphite catalyst layer 120. Accordingly, a graphene donor unit 14 including the elastic stamp layer 210, the plastic film 220, the release layer 233, and the graphene layer G may be formed.

Manufacture of an organic light-emitting device according to embodiments of the present invention and an organic light-emitting device thus manufactured will be described.

Figure 12:
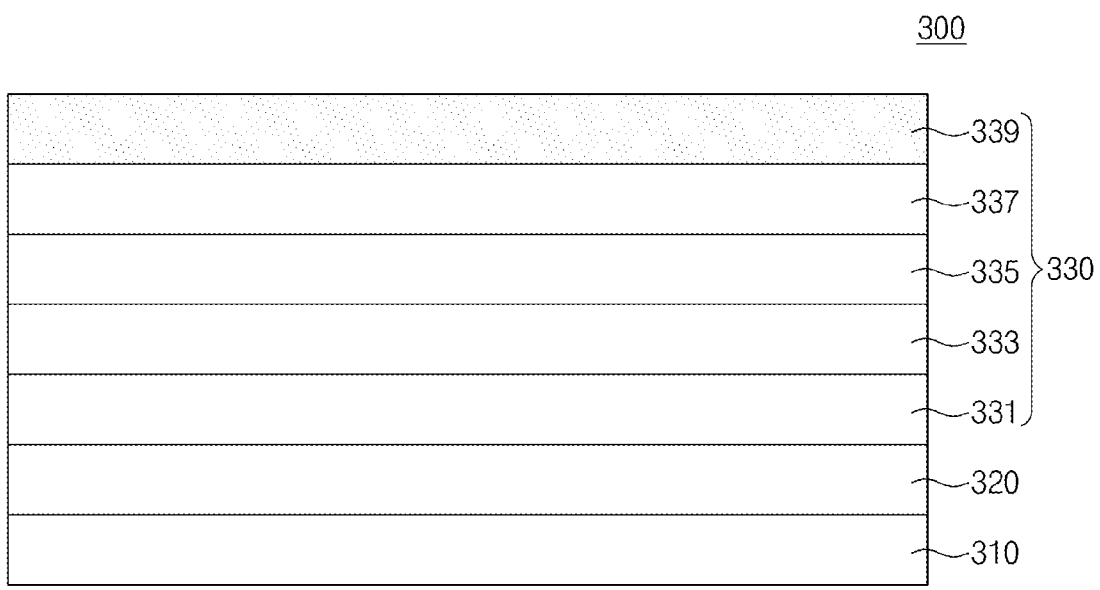
FIGS. 12 to 14 are cross-sectional views illustrating a manufacturing process of an organic light-emitting device according to an embodiment of the present invention.
Figure 13:
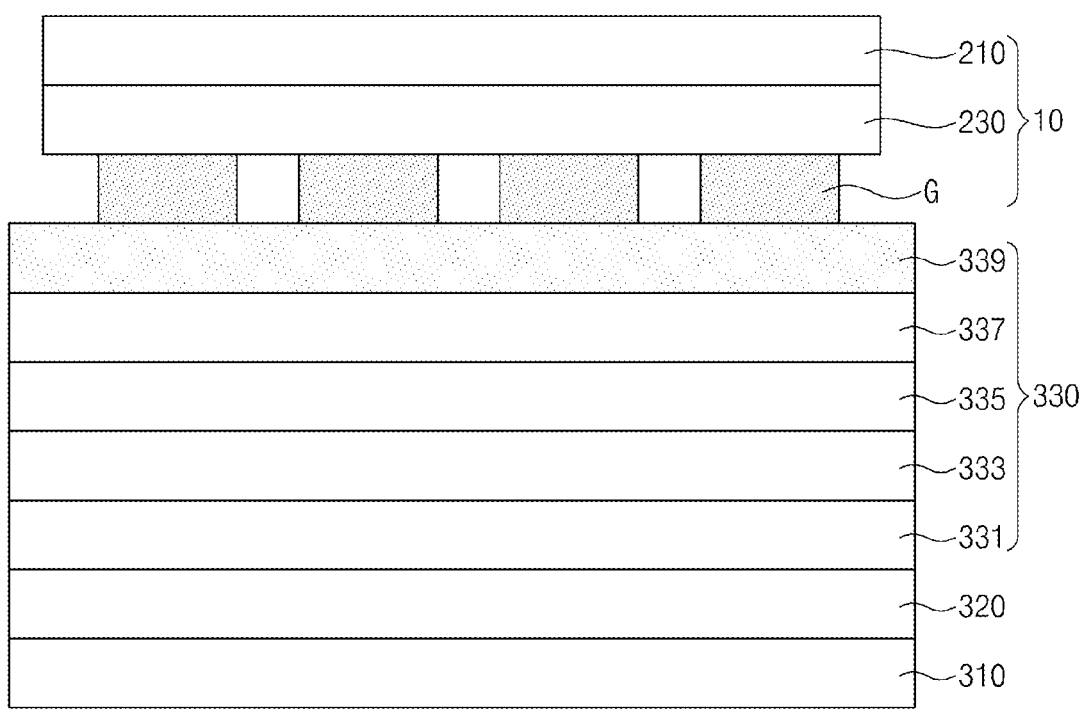
Figure 14:
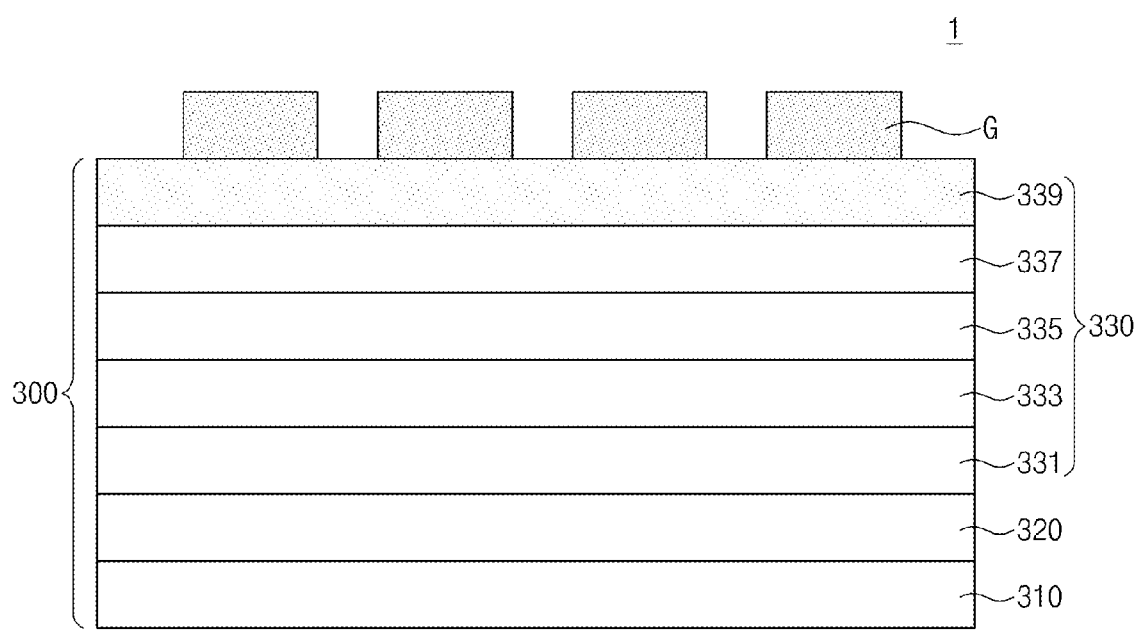

FIGS. 12 to 14 are cross-sectional views illustrating a manufacturing method of an organic light-emitting device according to an embodiment of the present invention. Hereinafter, descriptions overlapping with the aforementioned descriptions will be omitted.

Referring to FIG. 12, a device unit 300 including a substrate 310, a lower electrode 320, and an organic part 330 may be provided. The substrate 310, the lower electrode 320, and the organic part 330 may be sequentially stacked. The substrate 310 may be transparent. The substrate 310 may include at least one of glass, quartz, or plastic. The lower electrode 320 may include transparent conductive oxide such as indium tin oxide (ITO). As another example, the lower electrode 320 may include a metallic material. The organic part 330 may include a hole injection layer 331, a hole transport layer 333, a light-emitting material layer 335, an electron transport layer 337, and an electron injection layer 339. The hole injection layer 331, the hole transport layer 333, the light-emitting material layer 335, the electron transport layer 337, and the electron injection layer 339 may have a sequentially stacked structure. For example, the lower electrode 320 may be an anode and the hole injection layer 331 may be disposed more adjacent to the lower electrode 320 than the electron injection layer 339. Alternatively, the lower electrode 320 may be a cathode and the electron injection layer 339 may be disposed more adjacent to the lower electrode 320 than the hole injection layer 331. Hereinafter, a case will be described in which the lower electrode 320 is an anode. However, the present invention is not limited thereto.

The electron injection layer 339 may include a doped organic material. For example, a dopant may be injected into the electron injection layer 339 by metal deposition. For example, the dopant may include metal carbonate such as cesium carbonate ($Cs_2CO_3$), rubidium carbonate ($Rb_2CO_3$), potassium carbonate ($K_2CO_3$), or lithium carbonate ($Li_2CO_3$). As another example, the dopant may include metal oxide such as cesium oxide ($Cs_2O$), rubidium oxide ($Rb_2O$), potassium oxide ($K_2O$), and lithium oxide ($Li_2O$). As another example, the dopant may include alkali metal such as lithium (Li), sodium (Na), potassium (K), rubidium (Rb), or cesium (Cs). As another example, the dopant may include alkaline earth metal such as beryllium (Be), magnesium (Mg), strontium (Sr), barium (Ba), or radium (Ra). As another example, the dopant may include metal halide. For example, the electron injection layer 339 may include 1,3-bis(3,5-di(pyridine-3-yl)phenyl)benzene (BmPyPB) doped with $Cs_2CO_3$. The electron injection layer 339 may exhibit hydrophilicity due to the dopant.

Referring to FIG. 13, a graphene layer G of a graphene donor unit 10 may be attached to the electron injection layer 339 of the organic part 330. The graphene donor unit 10 may be any one of the graphene donor units 11, 12, 13, and 14 previously prepared in the examples of FIGS. 1 to 10. The graphene donor unit 10 may include the patterned graphene layer G. For example, the graphene layer G may be transferred to the electron injection layer 339 at 50° C. in vacuum. Since the electron injection layer 339 includes a dopant, adhesion between the electron injection layer 339 and the graphene layer G may be improved. For example, the adhesion between the electron injection layer 339 and the graphene layer G may be greater than adhesion between the graphene layer G and a release layer 230.

In a case where an upper electrode is formed by deposition of transparent conductive oxide, the substrate 310, the lower electrode 320, or the organic part 330 may be damaged in a deposition process of the upper electrode. In a case where the organic part 330 is directly coated with graphene, the formed graphene layer G may have low conductivity. According to the present invention, the graphene layer G may be formed on the organic part 330 by a transfer process using the graphene donor unit 10. Accordingly, the damage to the substrate 310, the lower electrode 320, and the organic part 330 may be prevented, and the graphene layer G may have high conductivity.

A patterning process of the graphene layer G may be performed before the attachment of the graphene layer G of the present invention to the organic part 330. For example, the graphene layer G may be patterned in a process of forming the graphene donor unit 10 as previously described in the example of FIG. 1. Accordingly, the damage to the substrate 310, the lower electrode 320, and the organic part 330 in the patterning process may be prevented.

Referring to FIG. 14 with FIG. 13, an elastic stamp layer 210 and the release layer 230 may be removed from the graphene layer G. For example, the release layer 230 may be separated from the graphene layer G by a physical or mechanical method. The adhesion between the graphene layer G and the release layer 230 may be in a range of 1 mJ/m² to 100 mJ/m². Since the adhesion between the graphene layer G and the release layer 230 may be lower than the adhesion between the electron injection layer 339 and the graphene layer G, the release layer 230 may be easily separated from the graphene layer G. The elastic stamp layer 210 may be removed together with the release layer 230. In a case where a plastic film (not shown) is further provided between the elastic stamp layer 210 and the release layer 230, the plastic film (not shown) may be removed together with the release layer 230. The elastic stamp layer 210 and the release layer 230 are removed and the remaining graphene layer G may then act as an upper electrode. The graphene layer G may have characteristics of low reflectance, high transmittance, and high electron conductivity. For example, the graphene layer G may have about 100 times higher electron mobility than silicon. The graphene layer G may deliver an about 100 times greater amount of current than copper. Since the graphene layer G may act as an upper electrode, the performance of an organic light-emitting device 1 may be improved.

When viewed from the top, the graphene layer G may have a shape in which honeycomb-shaped units are repeatedly disposed. The organic light-emitting device 1 of the present invention may be structurally and chemically stable by including the graphene layer G.

Figure 15:
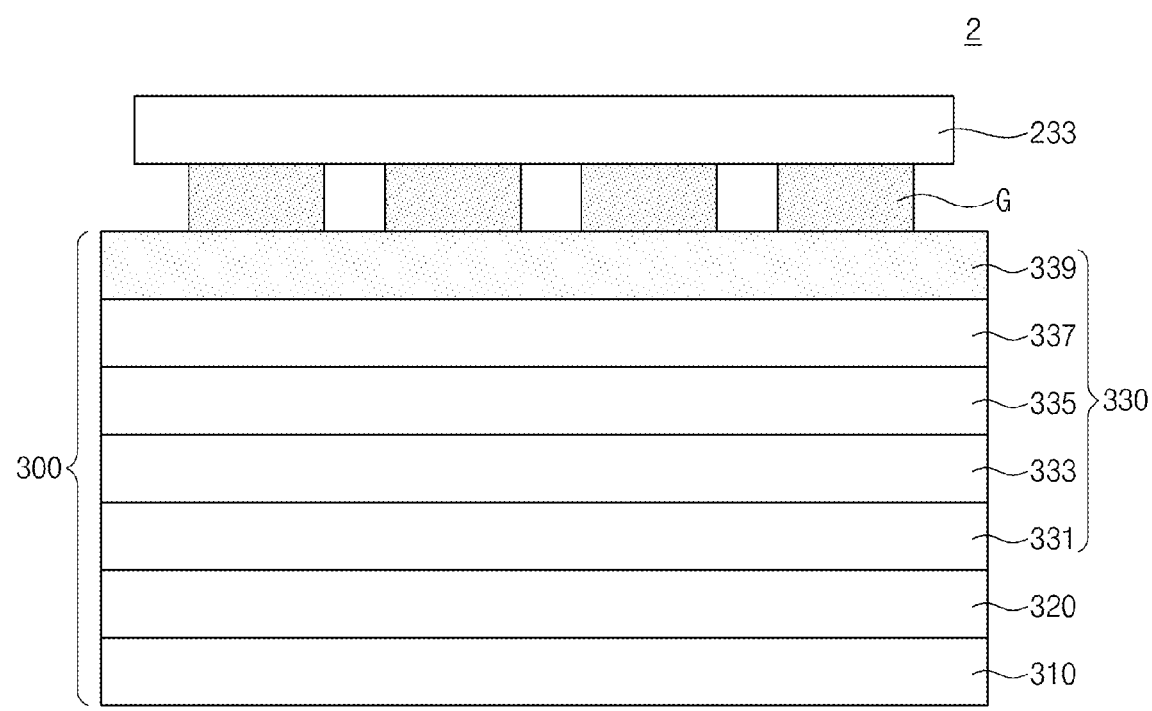
FIG. 15 is a cross-sectional view illustrating an organic light-emitting device manufactured according to another embodiment of the present invention.

FIG. 15 is a cross-sectional view illustrating an organic light-emitting device according to another embodiment of the present invention. Hereinafter, descriptions overlapping with the aforementioned descriptions will be omitted.

Referring to FIG. 15, an organic light-emitting device 2 may include a substrate 310, a lower electrode 320, an organic part 330, a graphene layer G, and a release layer 233.

The graphene layer G may act as an upper electrode. The release layer 233 may include polyisobutylene. The graphene layer G may be attached to the organic part 330 by using a graphene donor unit. The graphene donor unit may be the graphene donor unit 14 previously described in the examples of FIGS. 10 and 11. A device unit 300 may be the same or similar to that described in the example of FIG. 12. For example, the device unit 300 may include the substrate 310, the lower electrode 320, and the organic part 330. An upper portion of the organic part 330, for example, an electron injection layer 339 may include a dopant and may exhibit hydrophilicity. The dopant may be metal carbonate, metal halide, or metal oxide. An elastic stamp layer 210 may be removed. The release layer 233 may not be removed but may remain. Light generated in the organic part 330 may be easily emitted to the outside of the organic light-emitting device 2 by passing through the release layer 223 due to the difference in refractive indices between the release layer 233 and outside air. Accordingly, luminous efficiency of the organic light-emitting device 2 may be improved.

Figure 16:
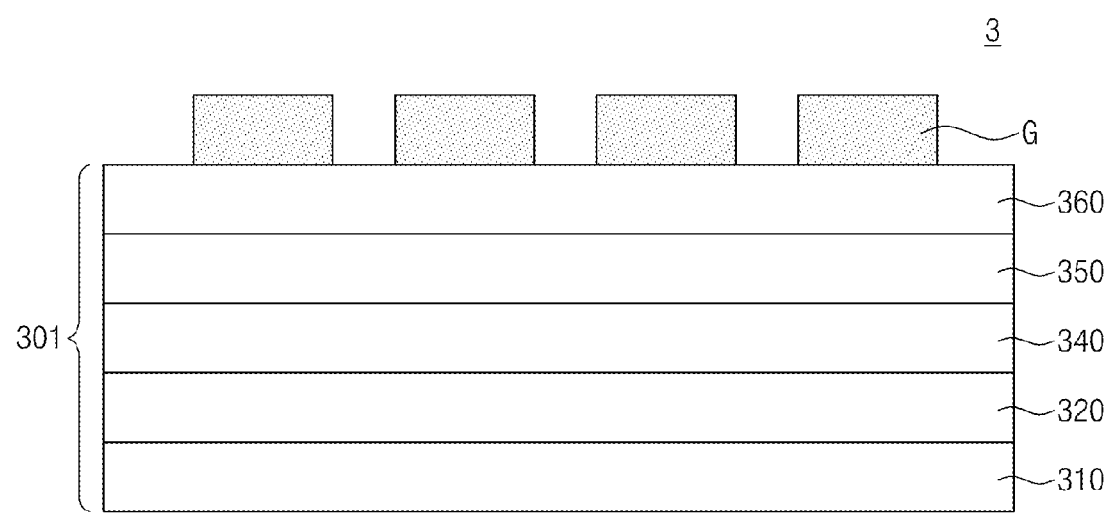
FIG. 16 is a cross-sectional view illustrating an organic light-emitting device manufactured according to another embodiment of the present invention.

FIG. 16 is a cross-sectional view illustrating an organic light-emitting device according to another embodiment of the present invention. Hereinafter, descriptions overlapping with the aforementioned descriptions will be omitted.

Referring to FIG. 16, an organic light-emitting device 3 may include a substrate 310, a lower electrode 320, a lower organic layer 340, a charge generation layer 350, an upper organic layer 360, and a graphene layer G. The organic light-emitting device 3 may be a tandem organic light-emitting device.

The graphene layer G may be attached to the upper organic layer 360 by the same or similar method to those described in the examples of FIGS. 13 and 14. For example, a graphene donor unit (not shown) may be disposed on a device unit 301 to allow the graphene layer G to face the upper organic layer 360. The graphene layer G may be transferred to the upper organic layer 360. However, the device unit 301 may include the substrate 310, the lower electrode 320, the lower organic layer 340, the charge generation layer 350, and the upper organic layer 360. The release layer (see 230 in FIG. 13) and the elastic stamp layer (see 210 in FIG. 13) may be removed to complete the manufacture of the organic light-emitting device 3. As another example, the lower electrode 320 or the charge generation layer 350 may include a graphene layer. In this case, the lower electrode 320 or the charge generation layer 350 may be formed by the same or similar method to those described in the examples of FIGS. 13 and 14. For example, the graphene layer G of the graphene donor unit may be attached to the substrate 310 to prepare the lower electrode 320. As another example, the graphene layer G of the graphene donor unit may be attached to the lower organic layer 340 to form the chare generation layer 350. Herein, the graphene donor unit may be any one of the graphene donor units 11, 12, 13, and 14 prepared as described above.

Figure 17:
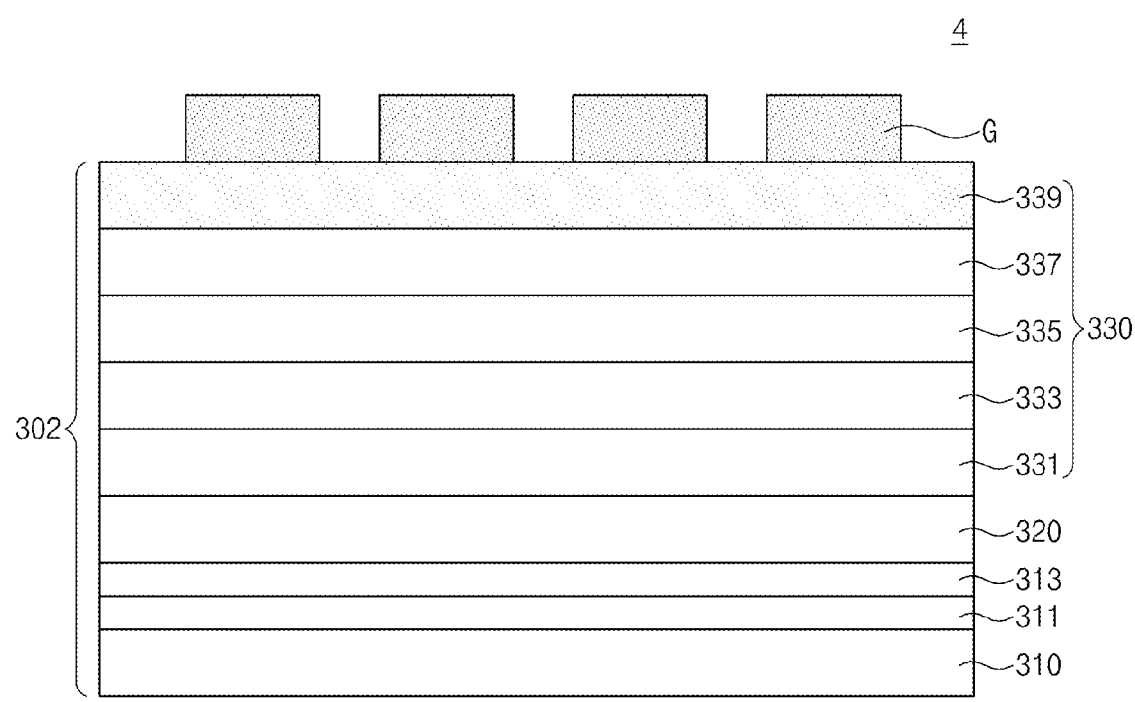
FIG. 17 is a cross-sectional view illustrating an organic light-emitting device manufactured according to another embodiment of the present invention.

FIG. 17 is a cross-sectional view illustrating an organic light-emitting device according to another embodiment of the present invention. Hereinafter, descriptions overlapping with the aforementioned descriptions will be omitted.

Referring to FIG. 17, an organic light-emitting device 4 may include a substrate 310, an optical filter 311, an insulation layer 313, a lower electrode 320, an organic part 330, and a graphene layer G. The substrate 310 may be a silicon substrate.

The graphene layer G may be in contact with the organic part 330 of a device unit 302 by the same or similar method to those described in the examples of FIGS. 13 and 14. For example, the graphene layer G may be conformally contacted with an electron injection layer 339. Herein, any one of the graphene donor units 11, 12, 13, and 14 prepared as described above may be used. The device unit 302 may include the substrate 310, the optical filter 311, the insulation layer 313, the lower electrode 320, and the organic part 330. The organic part 330 may include a hole injection layer 331, a hole transport layer 333, a light-emitting material layer 335, an electron transport layer 337, and an electron injection layer 339. The electron injection layer 339 may include a doped organic material. For example, the electron injection layer 339 may include a dopant such as metal carbonate, metal halide, or metal oxide. Thereafter, a release layer 230 and an elastic stamp layer 230 may be removed to complete the manufacture of the organic light-emitting device 4.

The present organic light-emitting device 4 may have a reflective mode and an emissive mode. Light generated from the organic part 330 during the emissive mode may be emitted to the outside by passing through the graphene layer G. Since the graphene layer G has high transmittance, luminous efficiency of the organic light-emitting device 4 may be improved. Light incident from the outside during the reflective mode may be reflected from the optical filter 311 by transmitting the graphene layer G.

Figure 18:
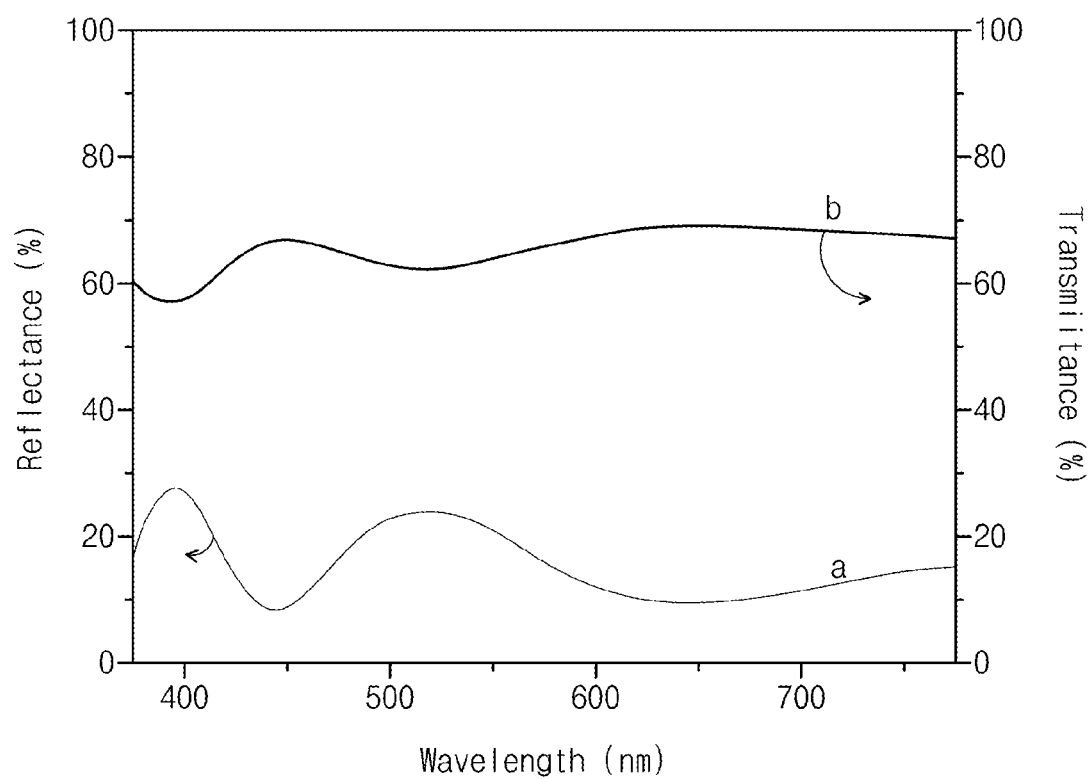
FIG. 18 is a graph illustrating reflectance and transmittance of an organic light-emitting device according to an embodiment of the present invention, according to a wavelength.

FIG. 18 is a graph illustrating reflectance and transmittance of an organic light-emitting device according to an embodiment of the present invention, according to a wavelength. Herein, the organic light-emitting device 1 previously manufactured in the examples of FIGS. 12 to 14 may be used. Hereinafter, descriptions overlapping with the aforementioned descriptions will be omitted.

Referring to FIG. 18 with FIG. 14, the organic light-emitting device 1 may exhibit a reflectance a of 20% or less and a transmittance b of 60% or more in a wavelength of 380 nm to 780 nm. Herein, the graphene layer G may act as an upper electrode, for example, a cathode. Light generated from the organic part 330 may easily transmit the graphene layer G. The organic light-emitting device 1 of the present invention may have high luminous efficiency.

According to the present invention, an organic light-emitting device may include a graphene layer. Since the graphene layer having high optical transmittance is used as an upper electrode, the organic light-emitting device may exhibit high luminous efficiency.

The graphene layer may be attached to an organic emission layer by using a graphene donor unit. Accordingly, a lower electrode and the organic emission layer may not be damaged in a formation process of the graphene layer. The graphene layer may be patterned in a preparation process of the graphene donor unit. Thus, the damage to the lower electrode and the organic emission layer may be further prevented.

While preferred embodiments of the present invention has been particularly shown and described with reference to the accompanying drawings, it will be understood by those of ordinary skill in the art that various changes in form and details may be made therein without departing from the spirit and scope of the present invention as defined by the following claims.

What is claimed is:

1. A method of manufacturing an organic light-emitting device, the method comprising:
    providing a graphene donor unit, wherein the graphene donor unit comprises a graphene layer, a release layer, and an elastic stamp layer which are sequentially stacked;
    providing a device unit, wherein the device unit comprises a substrate, a lower electrode, and an organic part which are sequentially stacked;
    contacting the graphene layer of the graphene donor unit with the organic part; and
    removing the release layer and the elastic stamp layer, wherein:
    the providing of the graphene donor unit comprises patterning the graphene layer such that, when taken from a sectional view, the graphene layer is separated into a plurality of graphene layer parts spaced apart from each other;
    the graphene layer comes in contact with the organic part, such that a top surface of the organic part has a plurality of first regions covered by the graphene layer and a second region without being covered by the graphene layer between the plurality of first regions; and
    the providing of the graphene donor unit includes forming the graphite layer on a mother substrate, then the patterning of the graphene layer, then disposing the patterned graphene layer on the release layer and the elastic stamp layer, and then removing the mother substrate from the graphite layer.

2. The method of claim 1, wherein the providing of the device unit further comprises doping an upper portion of the organic part, and
    adhesion between the doped organic part and the graphene layer is greater than adhesion between the graphene layer and the release layer.

3. The method of claim 1, wherein the providing of the graphene donor unit comprises:
    forming a graphite catalyst layer on the mother substrate;
    forming the graphene layer on the graphite catalyst layer;
    contacting the graphene layer with a first side of the release layer, wherein the elastic stamp layer is provided on a second side of the release layer, after the patterning of the graphene layer is performed; and
    etching the graphite catalyst layer to remove the graphite catalyst layer and the mother substrate.

4. The method of claim 1, wherein the providing of the graphene donor unit comprises:
    forming a hydrophilic functional group on a first side of the elastic stamp layer;
    providing a self-assembly material on the hydrophilic functional group of the elastic stamp layer; and
    forming the release layer on the elastic stamp layer by bonding the self-assembly material to the hydrophilic functional group of the elastic stamp layer.

5. The method of claim 4, wherein the self-assembly material comprises polydimethylsiloxane having a monocarbinol functional group.

6. The method of claim 1, wherein the providing of the graphene donor unit comprises:
    forming a self-assembly layer on a first side of the elastic stamp layer;

forming a silicon polymer layer on the self-assembly layer; and forming the release layer by irradiating the silicon polymer layer with ultraviolet light, wherein the release layer comprises the self-assembly layer and the silicon polymer layer.

7. The method of claim 6, wherein the forming of the release layer comprises polymerizing a material included in the silicon polymer layer and a material included in the self-assembly layer.

8. A method of manufacturing an organic light-emitting device, the method comprising:

providing a graphene donor unit, wherein the graphene donor unit comprises a graphene layer, a release layer, and an elastic stamp layer which are sequentially stacked;

providing a device unit, wherein the device unit comprises a substrate, a lower electrode, and an organic part which are sequentially stacked;

contacting the graphene layer of the graphene donor unit with the organic part; and removing the release layer and the elastic stamp layer, wherein the graphene donor unit further comprises the plastic film provided between the release layer and the elastic stamp layer.

9. The method of claim 8, wherein forming of the graphene donor unit comprises:

providing the plastic film;

forming the release layer on one side of the plastic film, wherein the release layer comprises methacrylate-multifunctionalized silsesquioxane; and forming the elastic stamp layer on the other side of the plastic film.

10. The method of claim 1, wherein the graphene layer is conformally contacted with the organic part.

11. The method of claim 1, wherein the release layer and the elastic stamp layer are removed such that the organic part is exposed to an exterior through gaps between the plurality of graphene layer parts.

12. The method of claim 1, wherein:

the graphene layer of the graphene donor unit is an upper electrode of the organic light-emitting device; and the device unit is provided without an upper electrode, so that the upper electrode is formed by disposing the graphene layer of the graphene donor unit on the organic part.

13. A method of manufacturing an organic light-emitting device, the method comprising:

providing a graphene donor unit, wherein the graphene donor unit comprises a graphene layer, a release layer, and an elastic stamp layer which are sequentially stacked;

providing a device unit, wherein the device unit comprises a substrate, a lower electrode, and an organic part which are sequentially stacked; and transferring the graphene layer of the graphene donor unit to the organic part, wherein the graphene layer of the graphene donor unit is in direct contact with the organic part.

14. The method of claim 13, wherein the providing of the device unit further comprises doping an upper portion of the organic part, and adhesion between the doped organic part and the graphene layer is greater than adhesion between the graphene layer and the release layer.

15. The method of claim 13, wherein the providing of the graphene donor unit comprises:

forming a hydrophilic functional group on a first side of the elastic stamp layer;

providing a self-assembly material on the hydrophilic functional group of the elastic stamp layer; and forming the release layer on the elastic stamp layer by bonding the self-assembly material to the hydrophilic functional group of the elastic stamp layer.

16. The method of claim 15, wherein the self-assembly material comprises 2-methoxy(propyleneoxy)propyl trimethoxysilane, tridecafluoro-1,1,2,2-tetrahydrooctyl trichlorosilane, undecyltrichlorosilane, octadecyl-trichlorosilane, trimethoxyphenylsilane, or polydimethylsiloxane having a monocarbinol functional group.

17. The method of claim 13, wherein the providing of the graphene donor unit comprises:

forming a self-assembly layer on a first side of the elastic stamp layer;

forming a silicon polymer layer on the self-assembly layer; and forming the release layer by irradiating the silicon polymer layer with ultraviolet light, wherein the release layer comprises the self-assembly layer and the silicon polymer layer.

18. The method of claim 17, wherein the forming of the release layer comprises polymerizing a material included in the silicon polymer layer and a material included in the self-assembly layer.

19. The method of claim 13, wherein the providing of the graphene donor unit comprises patterning the graphene layer such that, when taken from a sectional view, the graphene layer is separated into a plurality of graphene layer parts spaced apart from each other;

the graphene layer comes in contact with the organic part, such that a top surface of the organic part has a plurality of first regions covered by the graphene layer and a second region without being covered by the graphene layer between the plurality of first regions; and the providing of the graphene donor unit includes forming the graphite layer on a mother substrate, then the patterning of the graphene layer, then disposing the patterned graphene layer on the release layer and the elastic stamp layer, and then removing the mother substrate from the graphite layer.

20. The method of claim 1, wherein the graphene layer of the graphene donor unit is in direct contact with the organic part.

* * * * *